(12) United States Patent
Weyers et al.

(10) Patent No.: US 10,504,891 B2
(45) Date of Patent: Dec. 10, 2019

(54) SEMICONDUCTOR DEVICE AND A MANUFACTURING METHOD THEREFOR

(71) Applicant: Infineon Technologies Austria AG, Villach (AT)

(72) Inventors: Joachim Weyers, Hoehenkirchen (DE); Franz Hirler, Isen (DE); Maximilian Treiber, Munich (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/058,728

(22) Filed: Aug. 8, 2018

(65) Prior Publication Data
US 2019/0051647 A1 Feb. 14, 2019

(30) Foreign Application Priority Data
Aug. 9, 2017 (DE) .................. 10 2017 118 121

(51) Int. Cl.
| H01L 27/06 | (2006.01) |
| H01L 29/78 | (2006.01) |
| H01L 23/522 | (2006.01) |
| H01L 27/02 | (2006.01) |
| H01L 49/02 | (2006.01) |

(Continued)

(52) U.S. Cl.
CPC ...... *H01L 27/0629* (2013.01); *H01L 23/5223* (2013.01); *H01L 27/0255* (2013.01); *H01L 28/60* (2013.01); *H01L 29/0634* (2013.01); *H01L 29/0684* (2013.01); *H01L 29/1095* (2013.01); *H01L 29/157* (2013.01); *H01L 29/158* (2013.01); *H01L 29/4238* (2013.01); *H01L 29/7395* (2013.01); *H01L 29/7396* (2013.01); *H01L 29/7802* (2013.01); *H01L 29/404* (2013.01); *H01L 29/417* (2013.01)

(58) Field of Classification Search
CPC ......... H01L 29/06; H01L 29/10; H01L 29/15; H01L 29/40; H01L 29/41; H01L 29/42; H01L 29/73; H01L 29/78; H01L 28/60; H01L 27/06; H01L 27/062; H01L 27/0629; H01L 27/02; H01L 27/025; H01L 27/0255
USPC ........................................................ 257/139
See application file for complete search history.

(56) References Cited

U.S. PATENT DOCUMENTS

| 2015/0162407 | A1* | 6/2015 | Laven ................ H01L 29/1095 257/139 |
| 2015/0295079 | A1 | 10/2015 | Nakano et al. |

* cited by examiner

*Primary Examiner* — Monica D Harrison
(74) *Attorney, Agent, or Firm* — Murphy, Bilak & Homiller, PLLC

(57) ABSTRACT

A semiconductor device includes a semiconductor body having first and second opposing sides, an active area, and an inactive area which is, in a projection onto to the first and/or second side, arranged between the active area and an edge of the semiconductor body. A transistor structure in the active area includes a source region adjacent the first side and forms a first pn-junction in the semiconductor body. A gate electrode insulated from the semiconductor body is arranged adjacent to the first pn-junction. A capacitor in the inactive area includes first and second conductors arranged over each other on the first side. A source contact structure arranged above the capacitor is in Ohmic connection with the source region and the first conductor. A gate contact structure is arranged above the capacitor, spaced apart from the source contact structure and in Ohmic connection with the gate electrode and the second conductor.

20 Claims, 8 Drawing Sheets

(51) Int. Cl.
 *H01L 29/06* (2006.01)
 *H01L 29/15* (2006.01)
 *H01L 29/423* (2006.01)
 *H01L 29/739* (2006.01)
 *H01L 29/10* (2006.01)
 *H01L 29/40* (2006.01)
 *H01L 29/417* (2006.01)

SEMICONDUCTOR DEVICE AND A MANUFACTURING METHOD THEREFOR

TECHNICAL FIELD

Embodiments of the present invention relate to semiconductor devices, in particular to vertical power field-effect semiconductor transistors and manufacturing methods therefor.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, a low on-state resistance Ron and high breakdown voltages $U_{bd}$ are often desired.

To achieve low on-state resistance Ron and high breakdown voltages $U_{bd}$, charge-compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge-compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge-compensation structure remain "cool" compared with conventional semiconductor power devices.

Voltage converters typically employ field-effect transistors, in particular MOSFETs or IGBTs. Such voltage converters may e.g. convert a voltage from a common alternating voltage mains network to a direct voltage required for operating an electronic device at a low voltage e.g. in a range of 12 V or 48V down to below 1 V.

In hard on- and off-switching applications of power MOSFETs, in particular at higher current densities, oscillating transient values of the gate and drain voltages may be generated, so-called "ringing". Ringing effects refer to oscillations of gate and drain voltages, and are typically caused by parasitics of the switching circuitries, in particular source inductivities. With the often desired miniaturization of power MOSFETs, ringing effects may become more severe.

Accordingly, there is a need to improve field-effect semiconductor devices, in particular power field-effect semiconductor devices including charge-compensation field-effect semiconductor devices and manufacturing of those semiconductor devices.

SUMMARY

According to an embodiment of a semiconductor device, the semiconductor device includes a semiconductor body, an active area, and an inactive area. The semiconductor body has a first side and a second side opposite the first side. In a projection onto to the first side and/or the second side, the inactive area is arranged adjacent to the active area. A transistor structure is formed in the active area and includes a source region adjacent to the first side and forming in the semiconductor body a first pn-junction, and a gate electrode insulated from the semiconductor body and arranged adjacent to the first pn-junction. A capacitor is formed in the inactive area and includes a first conductor and a second conductor which are arranged over each other on the first side. A source contact structure is, in a vertical direction at least substantially perpendicular to the first side and/or the second side, arranged above the capacitor and in Ohmic connection with the source region and the first conductor. A gate contact structure is in the vertical direction arranged above the capacitor, spaced apart from the source contact structure and in Ohmic connection with the gate electrode and the second conductor.

According to an embodiment of a semiconductor device, the semiconductor device includes a semiconductor body, an active area and inactive area. The semiconductor body includes a first side defining a vertical direction, and a second side opposite the first side. The inactive area is, in a projection onto the first side and/or the second side, arranged between adjacent to the active area. A dielectric structure is arranged on the first side. A source terminal is formed on the dielectric structure. A gate terminal is formed on the dielectric structure. A transistor cell is formed in the active area and includes a source region disposed in the semiconductor body and in Ohmic connection with the source terminal overlapping with the source region in the projection, and a gate electrode insulated from the semiconductor body, in Ohmic connection with the gate terminal, and overlapping with the source terminal in the projection. A capacitor is formed in the inactive area, embedded in the dielectric structure, and includes a first conductor in Ohmic connection with the source terminal, and a second conductor in Ohmic connection with the gate terminal. In the vertical direction, a distance between the first conductor and the second conductor is less than about 200 nm.

According to an embodiment of a method for forming a semiconductor device, the method includes providing a semiconductor body including a first side, a second side opposite the first side, an active area, and an inactive area. In a projection onto a horizontal plane at least substantially parallel to the first side and/or the second side, the inactive area is adjacent to the active area. In the active area, the semiconductor body further includes a first pn-junction and a source region adjacent to the first side and extending to the pn-junction. A dielectric structure including two embedded conductive layers is formed on the first side so that a first layer of the two conductive layers is arranged in the inactive area and that a second layer of the two conductive layers comprises a first portion forming a gate electrode overlapping in the projection onto the horizontal plane with the first pn-junction, and a second portion spaced apart from and overlapping in the projection onto the horizontal plane with the first conductive layer, wherein a vertical distance between the first conductive layer and the second portion is less than about 200 nm. A source terminal in Ohmic connection with the source region and the first layer is formed on the dielectric structure.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1A:
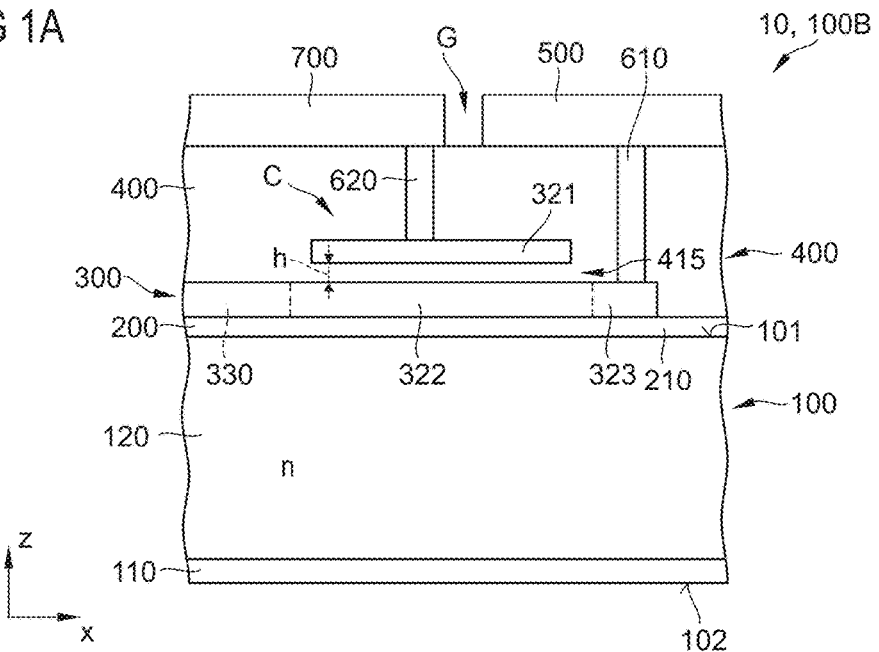
FIG. 1A illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body, typically a respective substantially flat surface. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^-$-doping and a p$^+$-doping region.

Specific embodiments described in this specification pertain to, without being limited thereto, semiconductor devices, in to particular field-effect semiconductor devices such as field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a drain metallization arranged on the second surface and a source metallization and an insulated gate electrode arranged on a first surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above. The field-effect semiconductor device may, however, also be an IGBT, in particular a vertical power IGBT.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V or about 1000V or about 3000V. Within this specification the terms "power semiconductor device" and "power semiconductor component" are used synonymously.

The term "edge-termination structure" as used in this specification intends to describe a structure that is configured to provide in a blocking mode a transition region in which a high electric voltage, i.e. a voltage of high absolute value compared to ground, such as a drain voltage around an active area of the semiconductor device changes gradually to the potential at or close to the edge of the device and/or to a reference potential such as ground, source- or gate potential. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are typically in low Ohmic connection with a drain electrode (drain metallization). The source region is typically in low Ohmic connection with a source electrode (source metallization).

In the context of the present specification, the term "in Ohmic connection" intends to describe that there is an Ohmic current path, e.g. a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical ((intimate physical)) contact and in Ohmic connection.

The terms "electrical connection" and "electrically connected" describes an Ohmic connection between two features.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field-plate" intends to describe a conductive region which is arranged next to a semiconductor region, for example the drift region or a part thereof, and/or next to a pn-junction formed in the semiconductor region, insulated from the semiconductor region, and made of a material of sufficient electric conductivity such as highly doped poly-silicon, a silicide, a metal or the like to form an equipotential region, i.e. a region in which a variation of the electric potential is at least one order of magnitude lower, more typically at least two orders of magnitude lower compared to a voltage drop in the adjacent semiconductor region(s) in an operating mode of the semiconductor device. The "field-plate" may be configured to expand a depleted portion in the semiconductor region by charging to an appropriate voltage, typically a negative voltage with regard to an adjacent semiconductor region for an n-type semiconductor region.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "mesa" or "mesa region" intends to describe a semiconductor region between two adjacent trenches extending into the semiconductor substrate or body in a vertical cross-section.

The term "pn-junction" as used in this specification intends to describe the boundary surface between (directly) adjoining semiconductor regions or semiconductor portions of different conductivity type.

The term "hard switching" as used in this specification intends to describe switching a semiconductor device from a non-conducting state with high Drain-Source-voltage $V_{DS}$ into a conducting state with low Drain-Source-voltage $V_{DS}$ and a load current flowing through the transistor (hard on-switching) or vice versa (hard off-switching) by changing an applied control voltage, typically a control voltage applied to a gate terminal of the semiconductor device, with an absolute speed (or ate) of $dV_{DS}/dt$ in a range of about $10^{10}$ V/s up to about $10^{12}$ V/s or more.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN). For power semiconductor applications currently mainly Si, SiC, GaAs and GaN materials are used. If the semiconductor body comprises a high band gap material, i.e. a semiconductor material having a band-gap above 1 eV, such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1A, a first embodiment of semiconductor device 10 is explained. FIG. 1A illustrates a vertical cross-section through a semiconductor body 100 of the semiconductor device 10. The semiconductor body 100 extends between a first side, typically a flat first surface 101, facing a vertical direction z, and second side, typically a flat second surface (back surface) 102 arranged opposite to the first surface 101. In a horizontal direction y that is substantially parallel to the first surface 101, the semiconductor body 100 is delimited by an edge or kerf, for example a sawing edge, which is at least substantially orthogonal to the first side or surface 101. In the following, the edge is also referred to as lateral edge. However, the edge is not shown FIG. 1A typically illustrating a portion of a peripheral area 100B of the semiconductor device 10 and the semiconductor body 100, respectively.

Figure 1B:
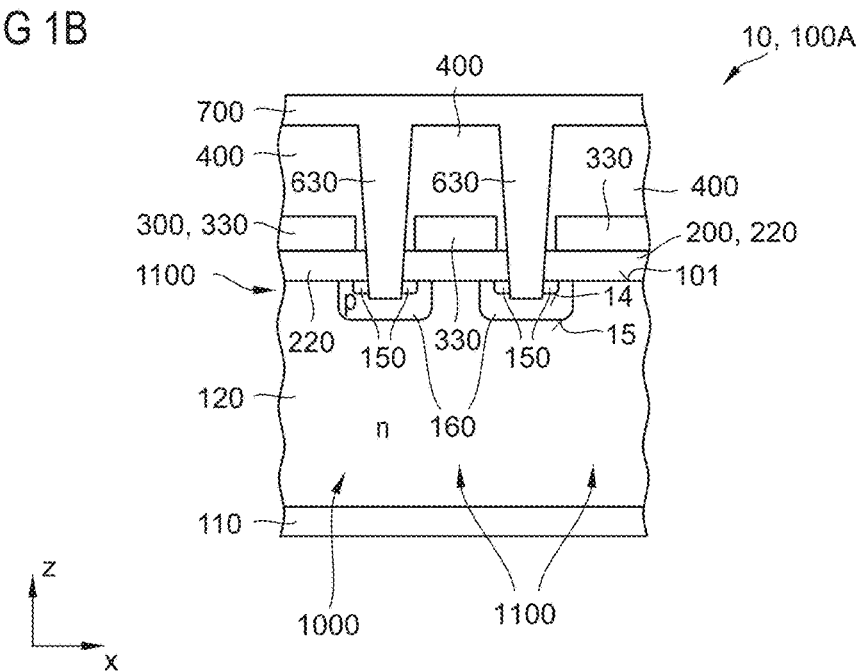
FIG. 1B illustrates a vertical cross-section through the semiconductor body of the semiconductor device illustrated in FIG. 1A according to an embodiment.

FIG. 1B illustrates, in a vertical cross-section, a portion of an active area 100A of the semiconductor device 10. FIGS. 1A and 1B may be portions of the same vertical cross-sections.

A transistor structure 1000 is formed in the active area 100A. In the exemplary embodiment, the transistor structure 1000 includes several MOSFET-cells 1100 three of which are shown in FIG. 1B.

Each of the transistor cells 1100 includes a gate electrode 330 embedded in a dielectric structure 200, 400 formed on the first side 101. More particular, the gate electrodes 330 are arranged on a first isolation layer 200 of the dielectric structure 200, 400. The first isolation layer 200 is formed on and at the first side 101, for example as a thermal oxide. At least portions of the first isolation layer 200 insulate the gate electrodes 330 from the semiconductor body 100, and thus form respective gate dielectric regions in the active area 100A.

Further, each transistor cell 1100 includes in the vertical cross-section two source regions 150 extending to the first isolation layer 200 and the first surface 101 of the semiconductor body 100, respectively. The source regions 150 are embedded in respective body regions 160 of the semiconductor body 100 which also extend to the first isolation layer 200.

The source regions 150 are of the first conductivity type (n-type in embodiments referring to n-channel MOSFETs) and the body regions 160 are of the second conductivity type (p-type in embodiments referring to n-channel MOSFETs).

The source regions 150 form with the embedding body region 160 a respective first pn-junction 14.

Further, each body region 160 typically forms a second pn-junction 15 with a drift region 120 of the semiconductor body 100.

In the illustrated embodiment of Vertical Diffused MOSFET (VDMOS), the drift region 120 also extends in the active area 100A to the first isolation layer 200 and the first surface 101, respectively.

Furthermore, a drain region 110 of the first conductivity type is provided at the second surface 102 of the semiconductor body 100. The drift region 120 is formed between the drain region 110 and the body regions 160 and is of a first conductivity type.

In embodiments referring to IGBTs, instead of a drain region a collector region 110 of the second conductivity type is provided.

As can be seen from FIGS. 1A and 1B, FIG. 2 and FIG. 6, the first isolation layer 200 may extend into the peripheral area 100B. In particular, the first isolation layer 200 may include a field dielectric layer 210 such as a field oxide in the peripheral area 100B and may further include a gate dielectric layer 220 such as a gate oxide in the active area 100A.

The first isolation layer 200 may, except for contact openings in the active area 100A, substantially or even completely cover the first side 101.

As can further be seen from FIGS. 1A and 1B, a source contact structure 700 may be formed in the active area 100A on the dielectric structure 200, 400, typically on a second isolation layer 400 formed on the first isolation layer 200. In the following, the first and second isolation layers 200, 400 are also referred to as first and second dielectric layers 200, 400.

Typically, the source contact structure 700 forms a source terminal.

The source contact structure 700 may at least substantially cover the dielectric structure 200, 400 in the active area 100A.

Figure 6:
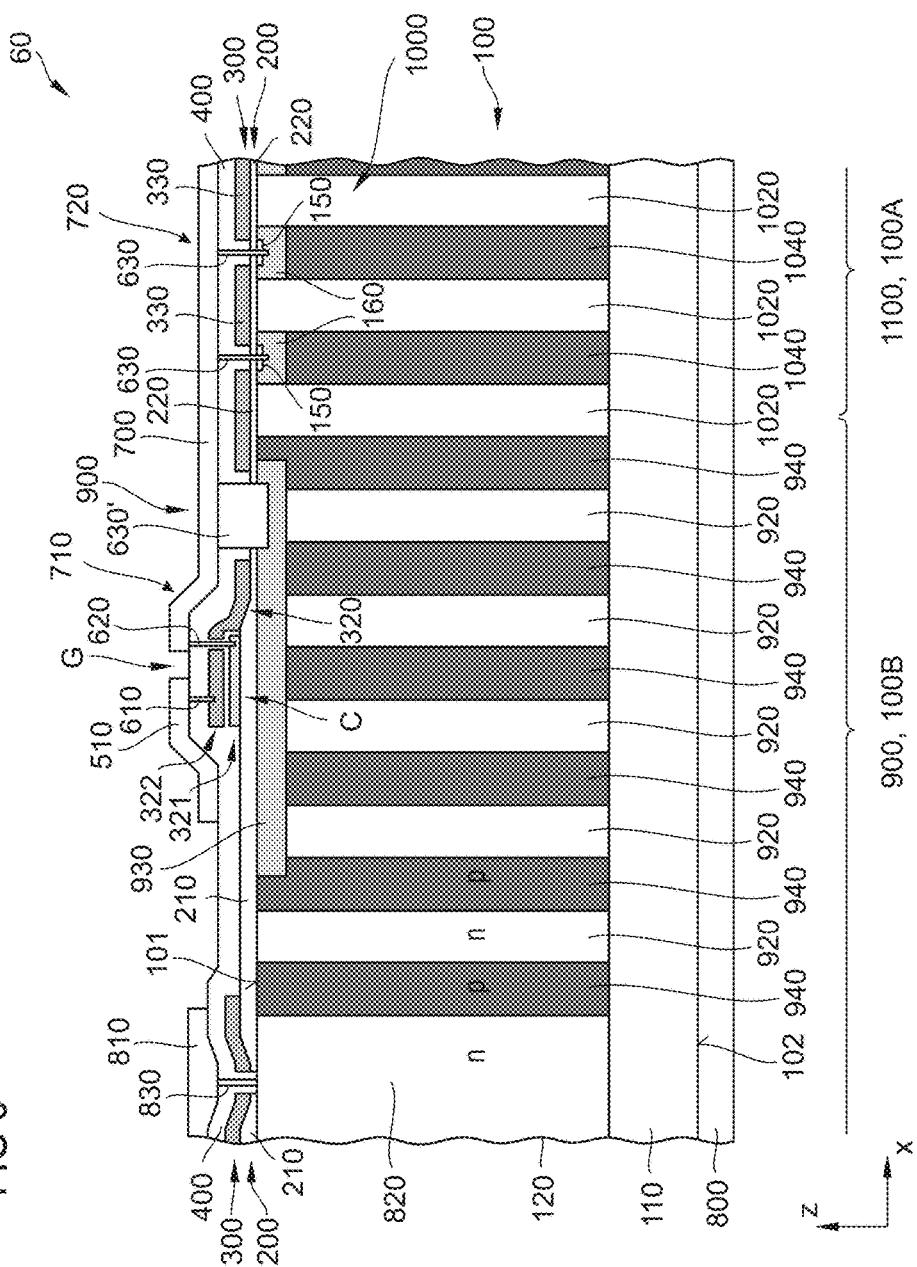
FIG. 6 illustrates a vertical cross-section through a semiconductor body of a semiconductor device according to an embodiment.

Further, the source contacts structure 700 typically extends (partially) peripheral area 1008 (see also FIG. 6).

In the active area 100A, first electric source contact portions 630 may be provided to interconnect the source contact structure 700 with the source regions 150 of the transistor structure 1000.

As illustrated in FIG. 1B, the source contact portions 630 may extend through the dielectric layers 200, 400, the first side 101, and the source regions 150, and partially into the respective body region 160.

Further, higher (p-doped) body contact regions (not shown) may be arranged between the second source contact portions 620 and the corresponding body region 160.

According to an embodiment, an integrated capacitor C is arranged on the first side 101 in the peripheral area 100B. As illustrated in FIG. 1A, the capacitor C is typically arranged in a vertical direction that below the source contact structure 700.

Typically, the capacitor C includes a first conductor 321 and a second conductor 322 which are arranged over each other and are embedded in the dielectric structure 200, 400. A portion 415 of the dielectric structure 200, 400 between the conductor 321, 322 may form the dielectric medium 415 of the capacitor.

The term capacitor as used in this specification shall describe a passive two-terminal electrical component specifically designed to store electrical energy in a (static or dynamic) electric field.

The capacitor C is typically implemented as parallel-plate capacitor.

As explained below with regard to FIG. 4 in more detail, the capacitor C provides an additional capacitance between the source contact structure 700 and a gate contact structure 500 spaced apart from the source contact structure 700 and in Ohmic connection with the gate electrodes 330. The additional capacitance is added to the gate-source capacitance of the active area 110A and the transistor structure formed therein, respectively. Due to the increased total gate-source capacitance Cgs of the semiconductor device 10, a larger immunity of the device during switching and a reduced ringing can be achieved.

On the gate contact structure 500 and the source contact structure 700, a further passivation layer (not shown) may be formed, which may include one or any combination of an imide, a nitride, an oxide or an oxynitride, for example.

As illustrated in FIGS. 1A and 1B, the second conductor 322 may be formed by an outer portion of the typically contiguous conductive layer 300, in particular a doped non-monocrystalline semiconductor layer such as doped poly-silicon layer 300, which also forms the gate electrodes 330 in the active area 100A.

Herein, the gate electrode(s) 330 and the second conductor 322 may be patterned parts of a same layer structure. According to an embodiment, the gate electrode(s) 330 is formed simultaneously with the second conductor 322.

For contacting the capacitor C, a second electric source contact portion 620 may be provided in the peripheral area 100B to interconnect the source contact structure 700 with the first conductor 321. Further an electric gate contact portion 610 may be provided in the peripheral area 100B to interconnect a terminal portion 323 of conductive layer 300 and thus the second conductor 322 with a gate contact structure 500 formed on the dielectric structure 200, 400 and/or at least partially in the peripheral area 100B.

In the following, the contact portions 610, 620, 630 are also referred to as gate through contacts 610, second source through contacts 620 and first source through contacts 630, respectively.

As shown in FIG. 1A, the first conductor 321 may be formed above the second conductor 322 by a conductive plate, typically a doped non-monocrystalline semiconductor plate, more typically a doped poly-silicon plate. Alternatively, the first conductor 321 may be formed below the second conductor 322 as explained below with regard to FIG. 2.

Accordingly, manufacturing of the capacitor C may be simple and may not interfere with processing steps used for manufacturing the transistor structure 1000.

Furthermore, the capacitor C may have a comparatively large area in the peripheral area 100B when seen from above.

Accordingly, the semiconductor device 10 may have a comparatively large total gate-source capacitance Cgs.

Typically, the capacitance of the capacitor C is at least 10%, more typically at least 30% or even 50% of the gate-source capacitance of the active area 100A. When using other dielectric materials or thinner dielectrics, for example by locally etch back of a deposited dielectric layer later forming the capacitor dielectric (215, 415), the capacitance of the capacitor C may be even higher than 50% of the gate-source capacitance Cgs.

For reasons of capacitance, the (vertical) distance h between the first and second conductors 321, 322 is typically comparatively small, e.g. less than about 200 nm, more typically less than about 150 nm, 110 nm or even 100 nm or 85 nm. For example, the distance h may be in a range from about 20 nm to about 80 nm.

The capacitance of the capacitor C is typically larger than about 30 pF, e.g. at least about 36 pF, more typically larger than about 90 pF or even larger than about 180 pF.

The capacitance values of 36 pF, 90 pF and 180 pF correspond to exemplary capacitors C silicon dioxide (SiO2) as dielectric medium 415 assuming an exemplary area of the conductors of the plate capacitor C of 0.2 mm$^2$, and distances h between the conductors 321, 322 of 200 nm, 80 nm and 40 nm, respectively.

Typically, the specific capacitance of the capacitor C is larger than about 170 pF/mm$^2$, more typically larger than about 400 pF/mm$^2$ or even about 800 pF/mm$^2$.

For example, a capacitor C with silicon dioxide (SiO2) as dielectric medium 415 may have a specific capacitance of about 172 pF/mm$^2$, 430 pF/mm$^2$ and 860 pF/mm$^2$ for distances h between the conductors 321, 322 of 200 nm, 80 nm and 40 nm, respectively.

According to an embodiment, the dielectric medium 415 is a thermal oxide, which is formed during a thermal oxidation process on a portion of a polysilicon layer 300. Further, the dielectric medium 415 and the gate dielectric layer 220 of the transistor structure 1000 may be formed in the same thermal oxidation process.

The specific capacitance (and thus the capacitance) of the capacitor C may be even higher if silicon nitride (Si3N4, having a relative dielectric constant of about 7.5 compared to about 3.9 of SiO2) or a so-called high-K dielectric is used as dielectric medium 415. High-K dielectrics may have a relative dielectric constant of up to about 100 (titan oxide, TiO2).

As illustrated in FIG. 1A, the capacitor C may be formed at the field dielectric 210 of the first isolation layer 200.

The thickness of the field dielectric 210 may be in a range of 0.5 μm to 5 μm or 1 μm to 3 μm.

The thickness of the gate dielectric 220 of the first isolation layer 200 may be smaller than the thickness of the field dielectric 210. The thickness of the gate dielectric 220 may be in a range of 5 nm to 200 nm, or 20 nm to 150 nm or 40 nm to 120 nm.

As illustrated in FIG. 1A, the second isolation layer 400 may be formed on the first isolation layer 200 and on the capacitor C, and the source contact structure 700 and the gate contact structure 500 may be formed on the second isolation layer 400.

In other embodiments, the capacitor C may be embedded and formed, respectively, in the second isolation layer 400. For example, a lower sub-layer of the second isolation layer 400 may be arranged between the second conductor 322 and the field dielectric layer 210. The material and/or the composition of the first and second isolation layers 200, 400 may differ.

The second isolation layer 400 may have different dielectric layers. Herein, a first layer of the second isolation layer 400 may include a tetraethylorthosilicate (TEAS) and/or an undoped silicate glass (USG) film. The thickness of the first layer of the second isolation layer 400 may be in a range of 50 nm to 500 nm. A second layer of the second isolation layer 400 may be made of phosphosilicate glass (PSG) or a borophosphosilicate glass (BPSG). The second layer of the second isolation layer 400 may also include a nitride. The thickness of the second layer of the second isolation layer 400 may be in a range of 200 nm to 2 μm. The second isolation layer 400 may also comprise an oxide/nitride/oxide (ONO)-structure.

The gate contact structure 500 may comprise a metal. Likewise, the source contact structure 700 may comprise a metal. The source contact structure 700 and the gate contact structure 500 may be patterned parts of a same conductive material. The gate contact structure 500 and the source contact structure 700 may be separate parts, e.g. due to lithographic patterning, of a common metal wiring layer or stacked layer. The gate contact structure 500 and the source contact structure 700 may be formed as a metal layer structure including the through contacts 610, 620, and 630. Such a metal layer structure may consist of or contain, as main constituent(s), aluminum Al, copper Cu or alloys of aluminum or copper, for example AlSi, AlCu, or AlSiCu. According to other embodiments, the gate contact structure 500, the source contact structure 700 and the through contacts 610, 620, and 630, may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, Pd and/or Co. The through contacts may also consist of polysilicon plugs and metal liners such as a titanium barrier layer and a titanium silicide layer typically arranged below the polysilicon plugs.

The through contacts 610, 620, and 630 may have a circular or polygonal shape when seen from above.

As illustrated in FIG. 1A, the first conductor 321 and the second conductor 322 may partially overlap with the source contact structure 700 and the gate contact structure 500 in a projection onto the first side 101 and when seen from above, respectively.

Further, the through contacts 610, 620 may, when seen from above, overlap with the capacitor C as shown in FIG. 1A for the through contact 620, or not as shown in FIG. 1A for the through contact 610.

Furthermore, the first conductor 321 and the second conductor 322 may, in the projection onto the first side 101 and when seen from above, respectively, bridge a gap G between the source contact structure 700 and the gate contact structure 500.

Figure 10:
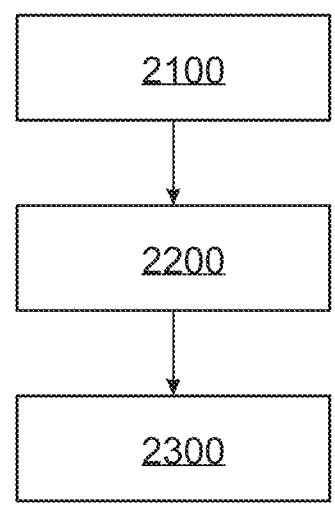
FIG. 10 is a schematic process chart of a method of manufacturing a semiconductor device.

FIG. 1A may correspond to a schematic cross-sectional view of portions of a semiconductor device 10 taken along the section planes D-D' and/or F-F' of FIG. 10 showing a schematic plan view of the semiconductor device 10. Likewise, FIG. 1B may correspond to a schematic cross-sectional view of portions of a semiconductor device 10 taken along the section planes H-H' and/or K-K' of FIG. 1C. Further, FIGS. 1A and 1B may correspond to schematic cross-sectional views of portions of the semiconductor device 10 taken along respective section planes which are vertically oriented in FIG. 1C.

Figure 1C:
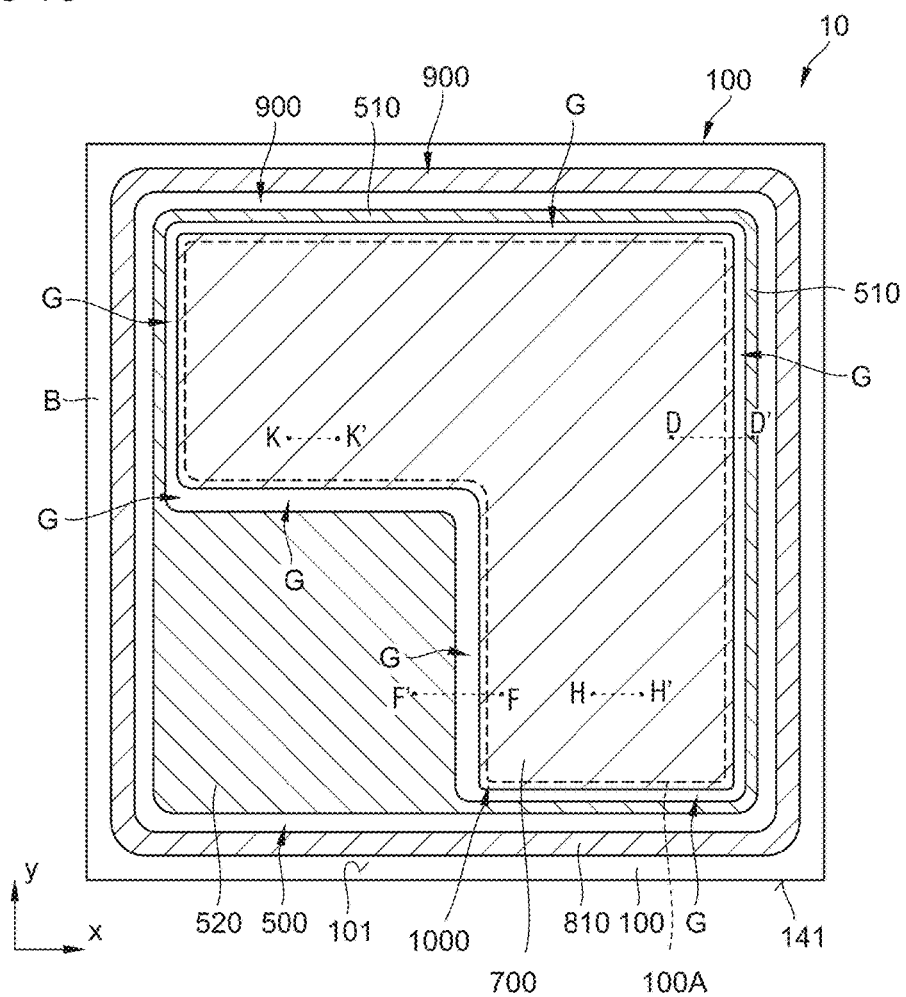
FIG. 1C illustrates a plan view of the semiconductor device illustrated in FIG. 1A and FIG. 1B according to an embodiment.

As can be seen from FIG. 1C, the gate contact structure 500 may comprise a gate line 510 and/or a gate pad 520. The gate pad 520 and the gate line 510 may be formed of a metal.

According to the embodiment of FIG. 1C, the source contact structure 700, the gate contact structure 500 including the gate line 510 and the gate pad (also referred to as gate terminal) 520, as well as a drain line 810 may be formed as separate parts of a patterned metal wiring layer or metal wiring stacked layer.

The drain line 810 may be implemented as a drain field plate, and thus act as an edge termination structure for the semiconductor device 10. As such the drain line 810 is typically arranged in an edge termination area 900 formed by the peripheral area 100B or an outer portion of the peripheral area 100B.

Typically, the peripheral area 1008 is arranged between the active area 100A and the edge 141. Furthermore, the peripheral area 100B typically surrounds the active area 100A when seen from above.

In the exemplary embodiment, the drain line 810 surrounds the gate contact structure 500 which surrounds the source contact structure 700.

As can be further seen from FIG. 1C, there are different parts of the gate contact structure 500, in which a longitudinal gap G between the gate contact structure 500 and the source contact structure 700 may be formed.

The longitudinal gap G may be formed in the edge termination area 900, as can also be seen, for example in FIG. 6.

The gate line 510 may be a so-called gate runner structure at an edge portion of the semiconductor device 10.

Figure 1D:
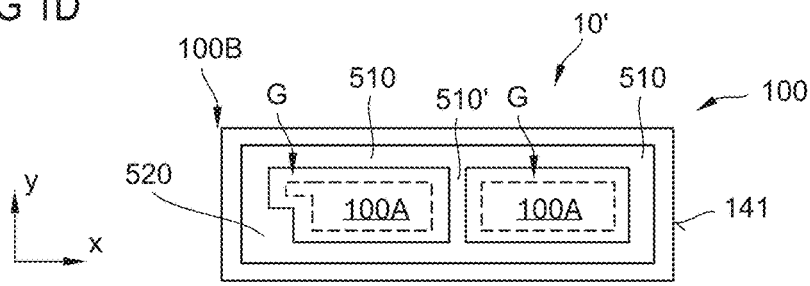
FIG. 1D illustrates a plan view of a semiconductor device according to an embodiment.

The gate line 510 may, however, also be or include a gate finger structure 510' extending into a transistor cell array 1000 and the active area 100A, respectively, as illustrated in FIG. 1D for the semiconductor device 10'. For sake of clarity, the plane view of FIG. 1D is less detailed than FIG. 1C.

Except for the layouts of the gate contact structure gate 510, 510', 520, the active area 100A and the source contact structure covering the active area 100A, the semiconductor device 10' may be similar to the semiconductor device 10. In the exemplary embodiment illustrated in FIG. 1D, the gate finger structure 510' divides the active area 100A into two separated portions which are surrounded by two separated gaps G when seen from above.

Since the gate finger region 510' does not include (active) transistor cells, the capacitor C may also at least partially be arranged in the gate finger region 510' of the semiconductor device 10'.

According to an embodiment, the capacitor C is integrated in an inactive area (without active transistor cells) of the semiconductor device which is adjacent to the active area 100A and may even adjoin the active area 100A. The inactive area may include the peripheral area 100B, in particular an (outer) edge termination region or area 900, and/or the gate finger region or area 510' which do not include transistor cells (for switching and/or controlling a load current).

Due to the gate finger structure 510', the inactive area 100B, 510' may surround two separated portions of the active area 100A when seen from above. Alternatively, the gate finger structure extends only partly into the (contiguous) active area.

Further, the semiconductor device and the gate contact structure, respectively, may have more than one gate fingers.

According to an embodiment, the gate line 510 may surround partly the source contact structure 700 within the horizontal plane.

As can be further seen from FIGS. 1C and 1D, there may be six or eight parts of the gate contact structure 500 and the source contact structure 700, at which longitudinal gaps G may be formed, since at these portions, the edge portions of the gate contact structure 500 and the source contact structure 700 are extended in a parallel direction.

Furthermore, the gate contact structure 500 and the source contact structure 700 may be spaced apart equidistantly, leading to longitudinal gaps G having a constant extension along a direction orthogonal to the length direction of a respective longitudinal gap G. The exemplary six longitudinal gaps G are connected to form a closed loop of longitudinal gaps G, which will be defined hereinafter as a total gap.

According to an embodiment, all longitudinal parts of the total gap as well as an area of the gate pad 520 may be used for implementing the capacitor C as explained above with regard to FIGS. 1A, 1B. In this embodiment, the first and second conductors of said capacitor typically surround the active area 100A when seen from above. Accordingly, the capacitor C may have a particular high capacitance. This is particularly useful for semiconductor devices 10 having a comparatively small surface area of the active area, i.e. a surface area of at most about 50 mm², more typically at most about 40 mm², at most about 20 mm², or even at most about 1 mm², e.g. about 0.3 mm² or even less.

In other embodiments, only the gate pad area and/or a portion of the total gap may be used for implementing the capacitor C. In these embodiments and explained below with regard to FIG. 3 in more detail, an electrostatic discharge protection (ESD) structure, in particular a polysilicon ESD protection diode connected between source and gate contact structure, may be implemented in a further portion, e.g. a remaining portion of the total gap region.

According to embodiments, a monolithic integration of the capacitor C and optionally of the polysilicon ESD protection diode in an area bridging the source and gate contact structure 500, 700 in a high voltage edge termination area of a power device, in a gate finger area 510', and/or in the gate pad area 520 is provided without spending additional chip area or at least with minimized area adder. For reliability of switching behavior of the power chips it is often important, that the capacitive and resistive network of the power chip system (metallization, contacts, gate runner, and gate polysilicon stripes) stays unchanged. Therefore, regarding a vertical process cross section, the capacitor C and optionally an ESD protection diode may be integrated underneath the edge termination construction and/or the underneath gate pad 520.

According to an embodiment, the capacitor C and optionally the ESD protection diode is integrated in an inactive area (without active transistor cells) of the semiconductor device which is adjacent to the active area 100A and may even adjoin the active area 100A. The inactive area may include the peripheral area 100B, in particular an (outer) edge termination region or area 900, and/or the gate finger region or area 510'.

Figure 2:
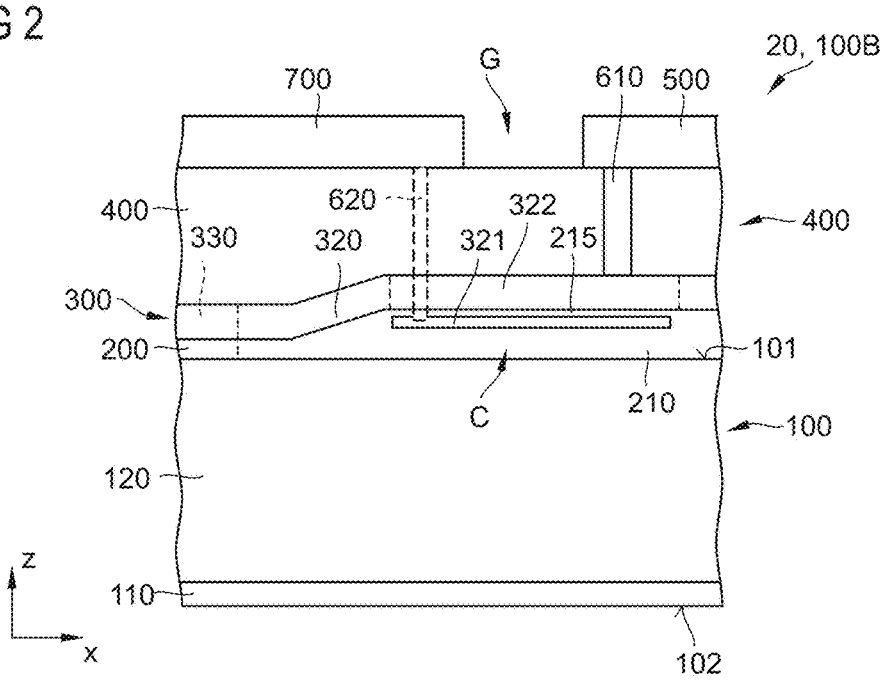
FIG. 2 illustrates a vertical cross-section through a semiconductor body of a semiconductor device according to an embodiment.

FIG. 2 illustrates a cross-section through a semiconductor device 20 which is similar to the semiconductor devices 10, 10' explained above with regard to FIGS. 1A to 1D and may also be implemented as a MOSFET or an IGBT.

The term "source contact structure" as used herein shall embrace an "emitter contact structure" of an IGBT. Likewise, the terms "source terminal" and "source region" as used herein shall embrace an "emitter terminal" and an "emitter region", respectively, of an IGBT.

However, the second conductor 322 of the capacitor C is arranged above the first conductor 321 in FIG. 2.

Further, the conductors 321, 322 may extend along the length direction (y in the exemplary embodiment) of the gap G.

As illustrated in FIG. 2, a gate interconnecting structure 320 may be provided between the second conductor 322 and the gate electrode layer 330, e.g. as a portion of the conductive layer 300. The gate interconnecting structure 320 is typically at least partially arranged below the source contact structure 700 and/or overlaps with the source contact structure 700 when seen from above. The gate interconnecting structure 320 may also at least partially bridge and/or overlap with the gap G when seen from above.

In the exemplary embodiment, the dielectric medium 215 of the capacitor C, in the following also referred to as capacitor dielectric, may be provided by the first isolation layer 200 or an additional dielectric layer formed at the first isolation layer 200.

Further, the first isolation layer 200 may be separated from the second isolation layer 400, in the peripheral area 100B, by the conductive layer 300.

According to an embodiment, the dielectric layer 215 is a thermal oxide layer, which is formed during a thermal oxidation process of a deposited and structures polysilicon layer 321.

Further, the source through contact 620 of semiconductor device 10' extends through the conductive layer 300.

As explained below with regard to FIG. 6, both the source through contact 620 and the conductive layer 300 may be electrically isolated by the second isolation layer 400 typically forming an interlevel dielectric, in particular as interlevel oxide.

Figure 3:
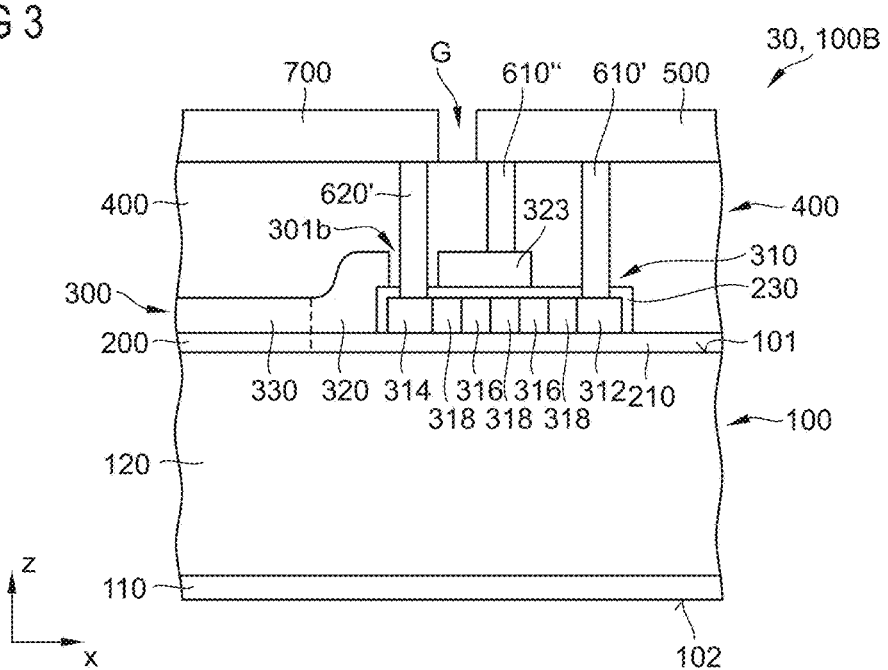
FIG. 3 illustrates a vertical cross-section through a semiconductor body of a semiconductor device according to an embodiment.

As can be seen from FIG. 3, an electrostatic discharge protection structure 310 may additionally be provided in a portion of the inactive area, typically a portion the peripheral area 100B of a semiconductor device 30. The semiconductor device 30 is typically similar to the semiconductor device 10 to 20 explained above with regard to FIGS. 1A to 2. Other cross-sections through semiconductor device 30 may even correspond to FIGS. 1B, 1C, 1D and/or 2.

The electrostatic discharge protection structure 310 may be implemented in or next to a portion of the polysilicon layer 300 as first and second regions 316, 318 of opposite conductivity type alternatingly or sequentially arranged along the horizontal direction y being perpendicular to the length direction (x) of a gap G.

Thus, the electrostatic discharge protection structure 310 may include at least one polysilicon diode having the first and second regions 316, 318 connected in series. Herein, the resulting diode may be bidirectional symmetric, having an odd number of first and second regions 316, 318, e.g. an n-p-n- . . . -p-n structure.

As can be seen from FIG. 3, the part of a gate interconnecting structure 320 overlapping the electrostatic discharge protection structure 310 may be separated or electrically isolated from the electrostatic discharge protection structure 310 by a dielectric layer 230.

According to an embodiment, the dielectric layer 230 is a thermal oxide layer, which is formed during a thermal oxidation process on the electrostatic discharge protection structure 310 comprising a polysilicon layer 300. Further, the dielectric layer 230 and the gate dielectric layer 200 or 220 of the transistor structure 1000 may be formed in the same thermal oxidation process.

As illustrated in FIG. 3, further through contacts 610', 610" and 620' may be provided for contacting the electrostatic discharge protection structure 310 with the gate contact structure 500 and the source contact structure 700.

As can be seen from FIG. 3, a first terminal 312 of the electrostatic discharge protection structure 310 may be electrically connected with the gate contact structure 500 by an electric contact structure (gate contact) 610'. A second terminal 314 of the electrostatic discharge protection structure 310 is electrically connected with the source contact structure 700 by the further electric contact structure (source contact) 620'. The electric contact structure 620' is extended along the vertical direction z through the second isolation layer 400 and a local opening 301b of the gate interconnecting structure 320, which is filled with a portion of the second isolation layer 400. The electrostatic discharge protection structure 310 is typically formed in an overlapping area between the part of the gate interconnecting structure 320 and the first surface 101 of the semiconductor body 100. The gate interconnecting structure 320 may have the local opening 301b through which a contact between the electrostatic discharge protection structure 310 and the source contact structure 700 is electrically isolated from the gate interconnecting structure 500.

In addition, a terminal 323 of the gate interconnecting structure 320 may be electrically connected with the gate contact structure 500 by the electric contact structure 610".

However, it is also possible that the terminal 323 of the gate interconnecting structure 320 may be electrically connected with the gate contact structure 500 by the first electric contact structure 610', wherein both the terminal 323 of the gate interconnecting structure 320 and the first terminal 312 of the electrostatic discharge protection structure 310 are in electrical contact with the gate contact structure 500 via the electric contact structure 610'. In such a case, the terminal 323 of the gate interconnecting structure 320 and the first terminal 312 of the electrostatic discharge protection structure 310 may be formed to overlap each other in a vertical direction z, being separated by the dielectric layer 230, wherein the electric contact structure 610' is extended through the terminal 323 and the dielectric layer 230, to contact both the terminal 323 and the first terminal 312.

Furthermore, the terminal 323 and the electric contact structure 610' may be omitted above the electrostatic discharge protection structure 310, if the conductive layer 300 is contiguous and already connected via a gate through contact 610 as explained above with regard to FIG. 1A.

Figure 4:
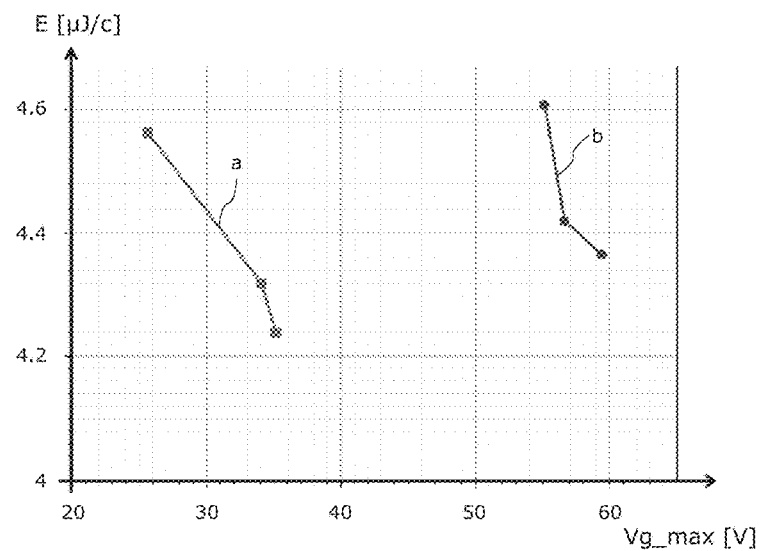
FIG. 4 shows a result of a simulation illustrating characteristics of the semiconductor device.

FIG. 4 shows a comparison of the characteristics of a transistor having an additional integrated capacitor C in the inactive area as explained herein and having a capacitance of 40% of the gate-source capacitance of the active area (graph (a)), and of a similar device without such an additional integrated capacitor (graph (b)). The x axis indicates ringing effects and represents a maximum oscillation voltage Vg_max of the gate-source voltage in volts at a source-drain current of 1 A. The y axis denotes the switching losses E of the semiconductor device defined as switching losses during switching on and off (Eon+Eoff) in µJ per switching cycle c. The points were determined for different values of the resistance between the gate electrodes 220 and the gate terminal 520.

With increasing electrical resistance between the gate electrodes 220 and the gate terminal 520, the switching losses increase (and the switching efficiency decrease). On the other side, the higher the switching losses, the lower the ringing effects. As can be taken from a comparison of the different characteristics for the different devices, by employing the integrated capacitor C, the ringing effects may be substantially reduced and suppressed, respectively, and at the same time, the switching losses may be reduced.

Note that the capacitance of the integrated capacitor C does not or almost not depend on the applied (gate-, source- and drain-) voltages. Accordingly, the switching behavior may be improved.

Note further that gate-drain capacitance Cgd of the semiconductor device may not be changed by the capacitor C integrated in the inactive area. The resulting enhanced Cgs/Cgd-factor may be used to get an improved voltage divider for transient hard switching processes and therefore an enhanced (dU/dt) switching immunity.

The additional process costs are very low. This is because only a few simple additional process steps may be used for forming the capacitor such as forming an additional doped poly-Si layer for one of the conductors and optionally a local etch back of a thermal oxide for further enhancing the capacitance.

Furthermore, integrating the capacitor in the inactive device area is much simpler and poses less manufacturing restrictions compared to integrating the capacitor in the active area, for example above the gate electrodes.

According to a more general concept, a semiconductor device of a planar gate electrode design comprises in an active area a vertical MOSFET or a vertical IGBT transistor structure having an internal (source-gate) transistor capacitance, and in an inactive area an integrated capacitor connected in parallel to (source and gate) terminals of the semiconductor device, and having an additional (source-gate) capacitance of at least 5% or even 10% of the internal transistor capacitance. This additional capacitor may, e.g. be implemented as a plate capacitor embedded in an edge termination structure and/or below and/or bridging a gap between the source-gate terminals when seen from above. Due to the presence of the additional capacitor, ringing effects of the transistor may be reduced.

Figure 5:
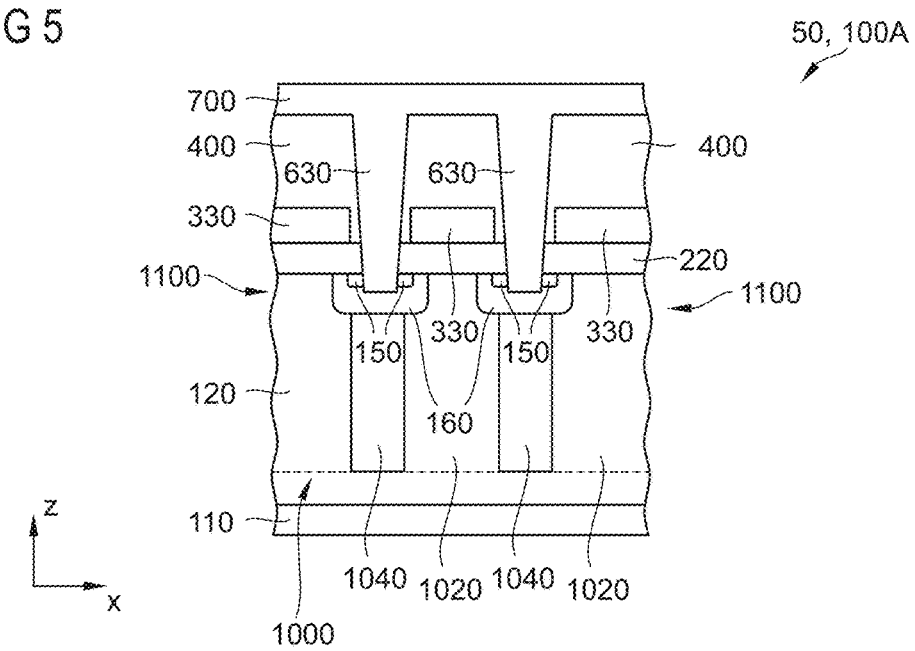
FIG. 5 illustrates a vertical cross-section through a semiconductor body of a semiconductor device according to an embodiment.

As illustrated in FIG. 5 showing a section through the active area 100A of a semiconductor device 50, the semiconductor device may also be implemented as charge-compensation power semiconductor device (superjunction device). The semiconductor device 50 is typically similar to the semiconductor devices explained above with regard to FIG. 1A to 3.

However, additional compensation regions 1040 of the second conductivity type adjoin a respective body region 160 and alternate with portions 1020 of the drift region 120 in the active area 100A.

Typically, a plurality, e.g. more than ten, of alternating drift portions 1020 and compensation regions 1040 forming respective pn-junctions with each other are arranged in the active area 100A.

In the vertical cross-section, the compensation regions 1040 may be formed as vertically orientated pillars, substantially vertically orientated strip-type parallelepipeds, rectangles or ellipsoids.

According to an embodiment, the doping concentrations of the compensation regions 1040 and the drift portions 1020 are chosen such that, in the off-state, their charges can be mutually depleted and that, in the on-state, an uninterrupted, low-resistive, substantially vertical conduction path is formed in the drift region 120.

A total number of free electrons provided by n-type dopants typically substantially matches a total number of free holes provided by p-type dopants at least in the active area 120. Typically, the total number of free electrons provided by the n-type dopants varies by less than 5%, more typically less than 1% from the total number of free holes provided by the p-type dopants. Accordingly, the drift portions 1020 and the compensation regions 1040 form a pn-compensation structure.

FIG. 6 illustrates a vertical cross-section through a semiconductor body 100 of a semiconductor device 60. The semiconductor device 60 is typically similar to the semiconductor devices 20 and 50 explained above with regard to FIG. 2 and FIG. 5, respectively.

The semiconductor device 60 is also implemented as a charge-compensation MOSFET having an integrated capacitor C in the peripheral area 100B, more particular in the edge-termination region 900.

A drain metallization 800 forming a drain terminal and in Ohmic connection with the drift region 120 via the drain region 110 is arranged on the second side 102, i.e. opposite to the source contact structure 700 and gate line 510 of the gate contact structure 510.

The drain metallization 800 may be formed as a lower metal wiring layer or metal wiring stacked layer.

In the exemplary embodiment, the drain metallization 800 completely covers the active area 100A and at least partly the peripheral area 100B typically surrounding the active area 100A when seen from above.

In the illustrated vertical cross-section, the gate line 510 is formed as a stepped field plate. Accordingly, the capacitor C is vertically arranged below and overlaps with an edge termination structure 510.

Likewise, an outer portion 710 of the source contact structure 700 is formed like a stepped field plate, while an inner portion 720 may form a source terminal.

Further, a drain line 810 in Ohmic connection with the drain metallisation 800 may be formed as separate parts of a patterned upper metal wiring layer or metal wiring stacked layer.

The drain line 810 and/or the gate line 510 may be substantially ring-shaped when seen from above.

As can be seen from FIG. 6, the source through contacts 630 vertically extend along the vertical direction z through the first and second isolation layers 200, 400, the polysilicon layer 300 forming the gate electrodes 330, and into the semiconductor body 100, to electrically connect the source contact structure 700 with the source regions 150.

To prevent a shortcut between the source through contacts 630 and the gate electrodes 330, contact holes being extended through the gate electrode 330 are further isolated by the second isolation layer 400 typically constituting a lining layer of the contact hole.

Likewise, the through contacts 630', 620 and 830 may be formed in a comparable manner.

For example, the electric contact structure 630' is extended through the second isolation layer 400, the gate electrodes 330 having the second isolation layer 400 as a dielectric lining layer for insulating the electric contact structure 630' from the gate electrodes 330, and the first isolation layer 200 into the semiconductor body 100, to contact the source contact structure 700 with a well region 930 of the second conductivity type (p-type in the illustrated embodiment of an n-channel power MOSFET).

The through contact 830 vertically extends from the drain line 810 through the second isolation layer 400, the polysilicon layer 300 and the first isolation layer 200 to or into a column 820 of the semiconductor body 100. The column 820 is of the first conductivity type and may extend from the surface 101 to the drain region 110 of the semiconductor body 100, to contact the drain region 110 on the second surface 102 with the drain line 810 formed over the first surface 101 of the semiconductor body 100. The doping concentration of the column 820 is typically in a range of $10^{15}$ cm$^3$ up to about $10^{20}$ cm$^{-3}$.

As can be further seen from FIG. 6, the capacitor C and the gate interconnection structure 320 are formed on the field dielectric layer 210 within the edge termination area 900 of the semiconductor device 60.

In other words, the first isolation layer 200 is formed as a gate dielectric layer 220 within the active area 100A with the transistor structure 1000, and the first isolation layer 200 is formed as a field dielectric layer 210 within the edge termination area 900.

Furthermore, columns or bubbles 1020 of the first conductivity type and columns or bubbles 1040 of the second conductivity type may be implemented beneath the active transistor cell field 1100 of the transistor structure.

In addition, columns or bubbles 920 of the first conductivity type and columns or bubbles 940 of the second conductivity type may be implemented beneath the well region 930 and the field oxide region 210 of the edge termination area 900.

In the exemplary embodiment, the columns or bubbles 940, 1040 typically forming compensation regions have in the active area 100A and the peripheral area 100B the same horizontal pitch.

The term "pitch" as used within this specification intends to describe a distance between repeated elements in a structure possessing translational symmetry and typically corresponds to length of a primitive axis (vector) of the structure and length of a base vector of a regular lattice, respectively.

Furthermore, the columns or bubbles 1040 in the active area 100A and the columns or bubbles 940 in the peripheral area 100B may extend to the same vertical depth.

As illustrated in FIG. 6, the columns or bubbles (compensation regions) 940, 1040 may at least substantially extend to the drain region 110.

However, the compensation regions 940, 1040 may also be spaced apart from the drain region 110 by an additional field-stop layer of the first conductivity type arranged on the drain region 110 (not shown), and/or by a higher doped current-spread portion of the drift region 120.

At least the compensation regions 1040 of the active area 100A are in Ohmic connection with the source contact structure 700.

As illustrated in FIG. 6, one or more outer compensation regions 940 may also be floating.

Figure 7:
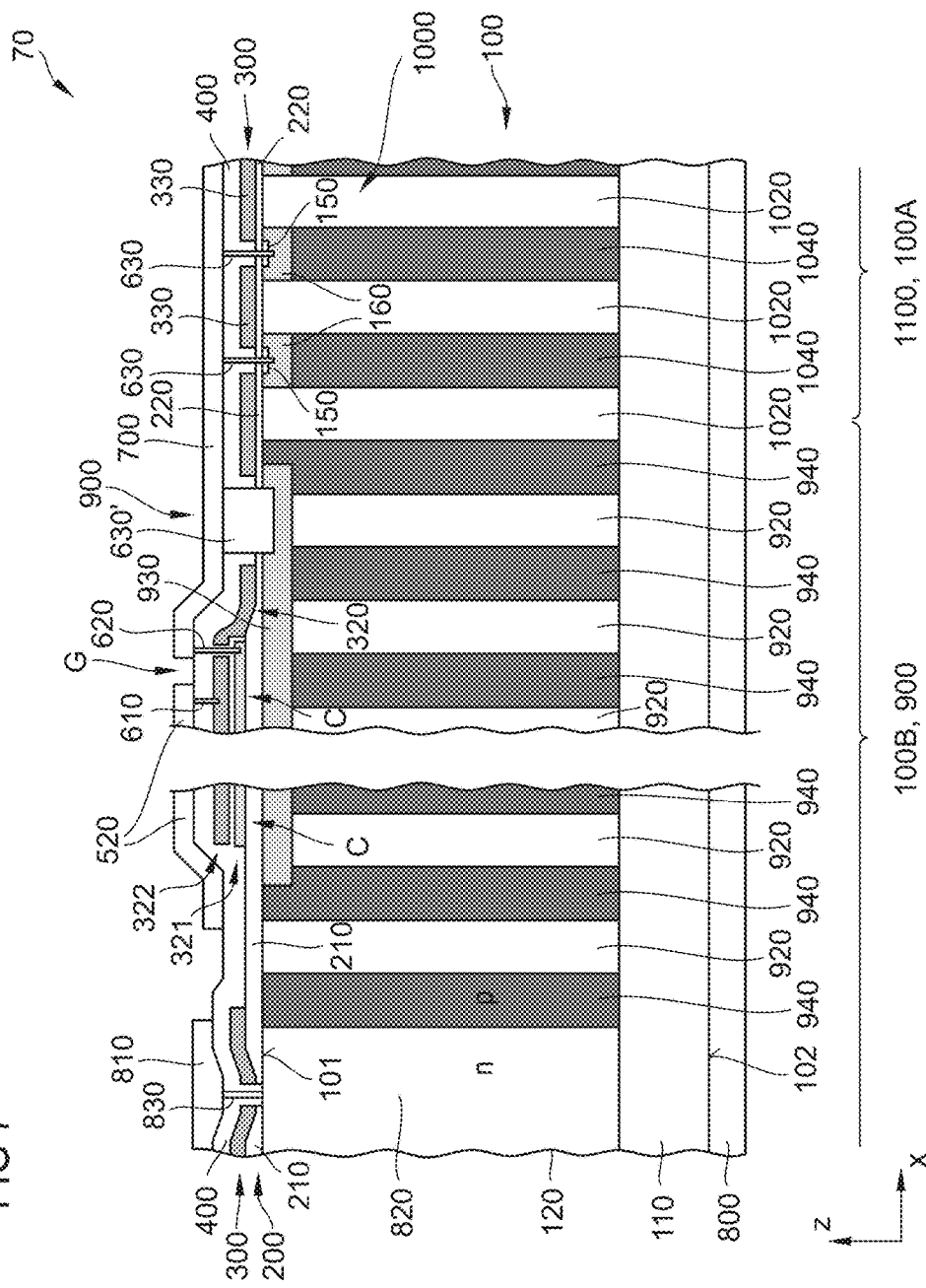
FIG. 7 illustrates a vertical cross-section through a semiconductor body of a semiconductor device according to an embodiment.

FIG. 7 illustrates a vertical cross-section through a semiconductor body 100 of a semiconductor device 70, more particular a vertical cross-section also running through a gate pad area 520 of the semiconductor device 70. The semiconductor device 70 is typically similar to the semiconductor devices 60 explained above with regard to FIG. 6. FIG. 7 may even at least substantially correspond to a different vertical cross-section through the semiconductor device 60.

As illustrated in FIG. 7, the capacitor C may also be implemented below the gate pad or gate terminal 520.

In particular for comparatively small power devices, the gate pad area may be comparatively large. Accordingly, the capacitance of the capacitor C or the portion of the capacitor C below the gate pad area may be comparatively large.

The surface area of the capacitor C divided by the surface area of the active area 100A is typically in a range of about 0.05 about to 0.7, more typically in a range of about 0.1 to about 0.5.

Figure 8:
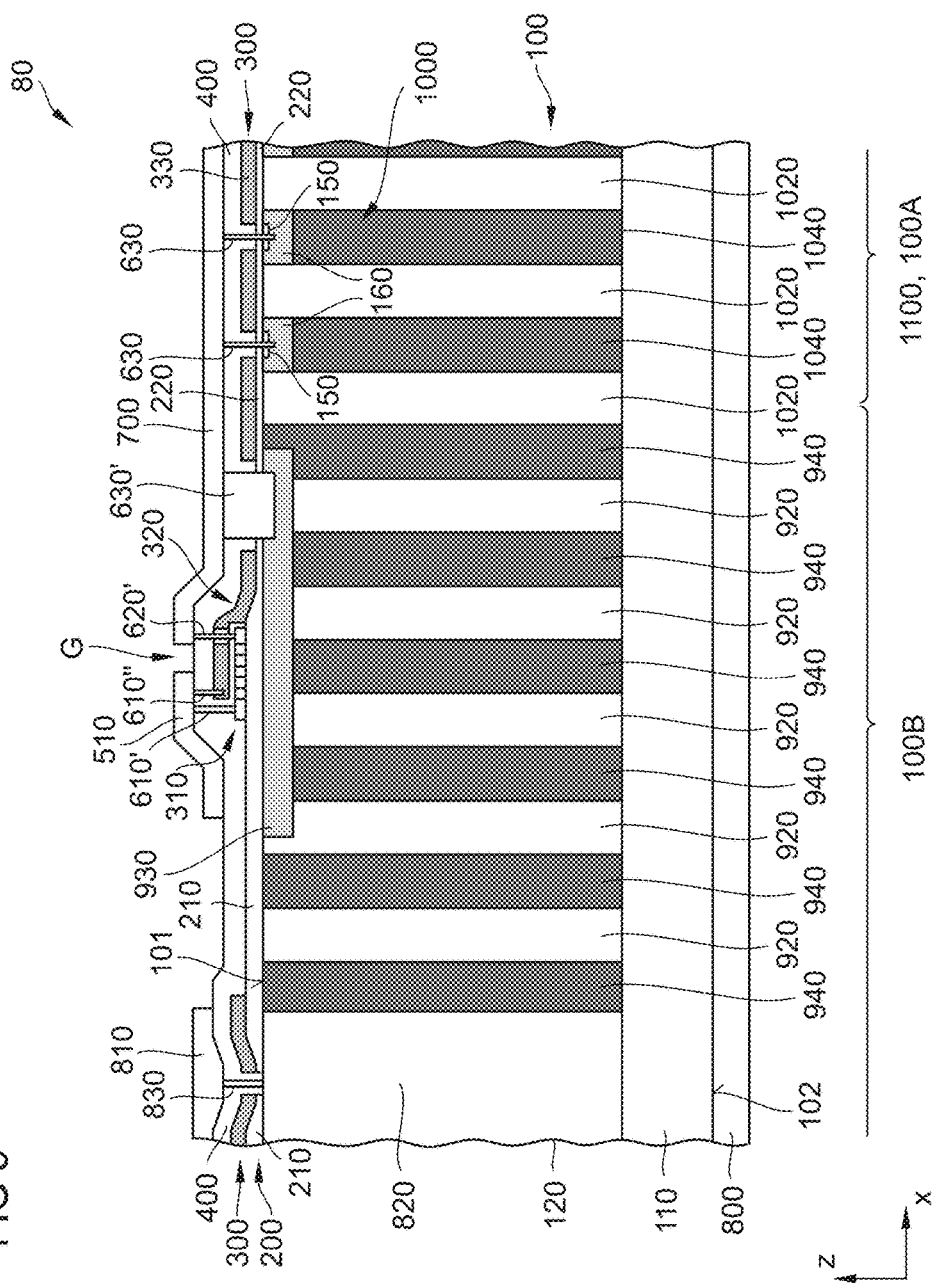
FIG. 8 illustrates a vertical cross-section through a semiconductor body of a semiconductor device according to an embodiment.

FIG. 8 illustrates a vertical cross-section through a semiconductor body 100 of a semiconductor device 80. The semiconductor device 80 is typically similar to the semiconductor devices 60, 70 explained above with regard to FIGS. 6, 7. FIG. 8 may even at least substantially correspond to a different vertical cross-section through the semiconductor devices 60, 70.

However, an electrostatic discharge protection structure 310 as explained above with regard to FIG. 3 is additionally arranged in a portion of the peripheral area 1068 of the semiconductor device 80.

In the exemplary embodiment, the electrostatic discharge protection structure 310 is formed in the gap area below the gap G between the gate field plate 510 and the source contact structure 700.

Figure 9:
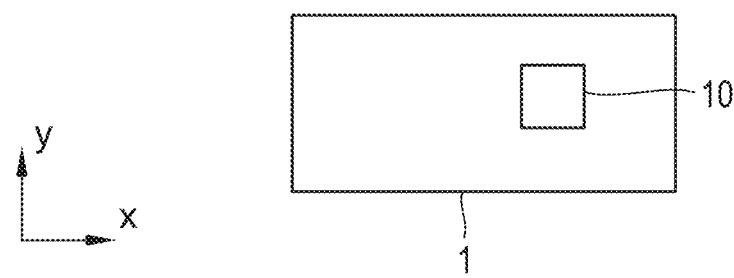
FIG. 9 shows a schematic view of an electric device according to an embodiment.

FIG. 9 schematically illustrates an electric device 1 comprising the semiconductor device 10 or any other of the semiconductor device explained above with regard to FIGS. 1A to 8. For example, the electric device may be a switched mode power supply (SMPS), a switched mode power supply comprising power factor correction, a fly back converter and any kind of electric device comprising a switched mode power supply.

A schematic flow diagram for illustrating a method 2000 of manufacturing the semiconductor device as explained above with regard to FIGS. 1A to 8 is depicted in FIG. 10.

In a process block 2100, a semiconductor body, typically a wafer, extending between a first side and a second side opposite the first side, and having (per device region in embodiments referring to manufacturing on wafer level) an active area and an inactive area which is, in a projection onto a horizontal plane substantially parallel to the first side, adjacent to the active area, and a source region adjacent to the first side, and extending to a first pn-junction arranged in the active area is provided. The first and second sides are typically respective flat surfaces.

Typically, a transistor structure, more typically a vertical power FET-structure (in particular a power MOSFET- or IGBT-structure) such as a plurality of VDMOS-structures is formed in the active area of the semiconductor body.

Furthermore, at least the active area of the provided semiconductor body may include a compensation structure.

Charge-compensation semiconductor devices may be produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge-compensation regions (compensation regions) and n-type charge-compensation regions (drift portions). The manufacturing of the actual devices can then be conducted at this point.

Another technique for fabricating charge-compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge-compensation semiconductor devices as explained above with regard to FIGS. 5 to 8.

In a process block 2200, a dielectric structure including in the peripheral area an embedded capacitor is formed on the first side.

The dielectric structure may include two embedded conductive layers (also) used as conductors of the capacitor, typically two doped poly-Si layers.

A first layer of the two conductive layers may be arranged in the inactive area and a second layer of the two conductive layers may have first portions forming planar gate electrodes in the active area which overlap with the first pn-junctions when seen from above, and a second portion which is vertically spaced apart from and overlaps with the first conductive layer when seen from above.

According to an embodiment, a vertical distance between the first conductive layer and the second portion is less than about 200 nm.

For example, a lower dielectric sub-structure of the dielectric structure may be formed on the first side. The lower dielectric sub-structure typically includes a gate dielectric layer in the active area and a field dielectric layer in the inactive area, in particular in a peripheral and/or edge termination area of the inactive area.

The field dielectric layer may have a thickness in a range between 0.5 μm to 5 μm or 1 μm to 3 μm.

The thickness of the gate dielectric layer may be in a range between 5 nm to 500 nm, more typically in a range between about 5 nm to 200 nm, about 20 nm to 150 nm, or about 40 nm to 130 nm.

The field dielectric layer may be a field oxide layer which is formed by deposition or oxidation on the first side.

In embodiments referring to the manufacturing of semiconductor devices with an additional capacitor having a lower (first) conductor connected to the source terminal and an upper (second) conductor connected to the gate terminal (see e.g. FIGS. 2 and 6 to 8), the following process sequence may be used: The lower (first) conductor is formed on the field dielectric layer, typically by depositing poly-Si and structuring the deposited poly-Si. The poly-Si may be deposited as doped poly-Si. Alternatively and/or in addition, dopants may be implanted after depositing poly-Si. Thereafter, a capacitor dielectric may be formed on the lower conductor. This may include thermal oxidizing and/or depositing a dielectric material to form an intermediate dielectric layer on the lower conductor. Further, local back-etching may be used above the lower conductor to reduce the thickness of the intermediate dielectric layer and the capacitor dielectric, respectively. In an example, the field dielectric layer is formed on the first side and patterned in such a way that the field dielectric layer is removed to expose the first side in the active area. In a second process, then the thermal oxidation process is performed to form the capacitor dielectric (the intermediate dielectric layer) and the gate dielectric layer in a common oxidation process. Thereafter, a conductive layer, which is also referred to as second layer, typically a poly-Si layer may be deposited in the active area and the peripheral area and structured (patterned), e.g. by a lithographical process, to form the gate electrodes in the active area and the upper conductor of the capacitor in the peripheral area. Thereafter, an upper dielectric layer of the dielectric structure may be deposited. For example, a TEAS-layer and/or an USG-layer and/or PSG or BPSG may be deposited. Thereafter, appropriate holes for electric contact structures may be etched and filled, e.g. with doped poly-Si.

In embodiments referring to the manufacturing of semiconductor devices with an additional capacitor having a upper (first) conductor connected to the source terminal and an lower (second) conductor connected to the gate terminal (see e.g. FIG. 1A), a similar process sequence may be used. However, the capacitor dielectric is formed on a portion of the structured second layer in the inactive (peripheral) area which forms the lower (second) conductor, e.g. by deposition and/or thermal oxidation and an optional back-etching, and the upper (first) conductor is formed thereon, typically as conductive poly-Si plate.

In a process block 2300, a source terminal in Ohmic connection with the source region(s) and the first conductor of the capacitor as well as a gate terminal in Ohmic connection with the gate electrodes and the second conductor of the capacitor is formed on the dielectric structure.

This may be achieved by common processes of depositing one or more conductive layers and subsequent patterning.

In embodiments referring to the manufacturing on wafer level, the semiconductor body (wafer) may be separated, e.g. by sawing along sawing or scribe lines, into individual semiconductor devices, so that the semiconductor devices have a corresponding lateral edge which delimits the semiconductor devices in a horizontal direction substantially parallel to the first side.

According to an embodiment, a semiconductor device includes a semiconductor body, an active area, and a peripheral area. The semiconductor body has a first side and a second side opposite the first side. In a projection onto to the first side and/or the second side, the peripheral area is arranged between the active area and an edge of the semiconductor body. A transistor structure is formed in the active area and includes a source or emitter region adjacent to the first side and forming in the semiconductor body a first pn-junction, and a gate electrode insulated from the semiconductor body and arranged adjacent to the first pn-junction. A capacitor is formed in the peripheral area and includes a first conductor and a second conductor which are arranged over each other on the first side. A source or emitter contact structure is arranged above the capacitor and in Ohmic connection with the source or emitter region and the first conductor. A gate contact structure is arranged above the capacitor, spaced apart from the source contact structure and in Ohmic connection with the gate electrode and the second conductor.

According to an embodiment, a semiconductor device includes a semiconductor body, an active area, and a peripheral area. The semiconductor body has a first side and a second side opposite the first side. In a projection onto to the first side and/or the second side, the peripheral area is arranged between the active area and an edge of the semiconductor body. A transistor structure is formed in the active area and includes a source region adjacent to the first side and forming in the semiconductor body a first pn-junction, and a gate electrode insulated from the semiconductor body and arranged adjacent to the first pn-junction. A capacitor is formed in the peripheral area and includes a first conductor and a second conductor which are arranged over each other on the first side. A source contact structure is, in a vertical direction at least substantially perpendicular to the first side and/or the second side, arranged above the capacitor and in Ohmic connection with the source region and the first conductor. A gate contact structure is in the vertical direction arranged above the capacitor, spaced apart from the source contact structure and in Ohmic connection with the gate electrode and the second conductor.

According to an embodiment, a semiconductor device includes a semiconductor body, an active area and peripheral area. The semiconductor body includes an edge, a first side defining a vertical direction, and a second side opposite the first side. The peripheral area is, in a projection onto the first side and/or the second side, arranged between the active area and the edge. A dielectric structure is arranged on the first side. A source terminal is formed on the dielectric structure. A gate terminal is formed on the dielectric structure. A transistor cell is formed in the active area and includes a source region disposed in the semiconductor body and in Ohmic connection with the source terminal overlapping with the source region in the projection, and a gate electrode insulated from the semiconductor body, in Ohmic connection with the gate terminal, and overlapping with the source terminal in the projection. A capacitor is formed in the peripheral area, embedded in the dielectric structure, and includes a first conductor in Ohmic connection with the source terminal, and a second conductor in Ohmic connection with the gate terminal. In the vertical direction, a distance between the first conductor and the second conductor is less than about 200 nm.

According to an embodiment, a semiconductor device includes a semiconductor body extending between a first side and a second side opposite the first side which are spaced apart from each other in a vertical direction. A plurality of field-effect transistor cells each comprising a gate electrode are arranged in an active area. A source or emitter terminal is arranged on the first side in the active area and in contact with the field-effect transistor cells. A gate terminal is arranged on the first side and in contact with the gate electrodes. An integrated capacitor connected to the gate terminal and to the source or emitter terminal is arranged outside the active area when seen from above and in the vertical direction between the first side and the gate terminal.

According to an embodiment of a method for forming a semiconductor device, the method includes providing a semiconductor body including a first side, a second side opposite the first side, an active area, and a peripheral area. In a projection onto a horizontal plane at least substantially parallel to the first side and/or the second side, the peripheral area surrounds the active area. In the active area, the semiconductor body further includes a first pn-junction and a source region adjacent to the first side and extending to the pn-junction. A dielectric structure including two embedded conductive layers is formed on the first side so that a first layer of the two conductive layers is arranged in the peripheral area and that a second layer of the two conductive layers comprises a first portion forming a gate electrode overlapping in the projection onto the horizontal plane with the first pn-junction, and a second portion spaced apart from and overlapping in the projection onto the horizontal plane with the first conductive layer, wherein a vertical distance between the first conductive layer and the second portion is less than about 200 nm. A source terminal in Ohmic connection with the source region and the first layer is formed on the dielectric structure.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a semiconductor body comprising a first side and a second side opposite the first side;
    an active area;
    an inactive area which is, in a projection onto to the first side, adjacent to the active area;
    a transistor structure formed in the active area and comprising
        a source region adjacent to the first side and forming in the semiconductor body a first pn-junction; and
        a gate electrode insulated from he semiconductor body and arranged adjacent to the first pn-junction;
    a capacitor formed in the inactive area and comprising a first conductor and a second conductor which are arranged over each other on the first side;
    a source contact structure arranged, in a vertical direction at least substantially perpendicular to the first side and/or the second side, above the capacitor and in Ohmic connection with the source region and the first conductor; and
    a gate contact structure arranged in the vertical direction above the capacitor, spaced apart from the source contact structure and in Ohmic connection with the gate electrode and the second conductor.

2. The semiconductor device of claim 1, wherein a distance between the first conductor and the second conductor is less than about 200 nm.

3. The semiconductor device of claim 1, wherein at least one of the first conductor and the second conductor overlaps in the projection with at least one of the source contact structure and the gate contact structure, and/or wherein the gate contact structure comprises at least one of a gate pad, a gate runner and a gate field plate arranged in the inactive area and/or at least substantially surrounding the source contact structure in the projection.

4. The semiconductor device of claim 1, further comprising at least one of:
    a body region disposed in the semiconductor body and forming the first pn-junction with the source region;
    a drift region disposed in the semiconductor body and forming a second pn-junction with the body region;
    a drain region disposed in the semiconductor body and in Ohmic connection with the drift region;
    a plurality of compensation regions, each of the compensation regions forming a pn-junction with a respective portion of the drift region;
    a drain terminal arranged on the second side and in Ohmic connection with at least one of the drift region and the drain region; and
    a drain line and/or a drain field plate in Ohmic connection with the drain terminal, arranged on the first side and in the inactive area, and/or in the projection at least substantially surrounding the source contact structure, the gate field plate and/or the gate contact structure.

5. A semiconductor device, comprising:
    a semiconductor body comprising a first side defining a vertical direction, and a second side opposite the first side;
    an active area;
    an inactive area which is, in a projection onto to the first side, adjacent to the active area;
    a dielectric structure arranged on the first side;
    a source terminal formed on the dielectric structure;
    a gate terminal formed on the dielectric structure;
    a transistor cell formed in the active area and comprising
        a source region in Ohmic connection with the source terminal overlapping with the source region in the projection, and disposed in the semiconductor body, and a gate electrode insulated from the semiconductor body, in Ohmic connection with the gate terminal, and overlapping with the source terminal in the projection; and
    a capacitor formed in the inactive area, embedded in the dielectric structure, and comprising a first conductor in Ohmic connection with the source terminal and a second conductor in Ohmic connection with the gate terminal, wherein a distance in the vertical direction between the first conductor and the second conductor is less than about 200 nm.

6. The semiconductor device of claim 5, further comprising at least one of:
    a body region disposed in the semiconductor body and forming a first pn-junction with the source region;
    a drift region disposed in the semiconductor body and forming a second pn-junction with the body region;
    a plurality of compensation regions, each of the compensation regions forming a pn-junction with a respective portion of the drift region;
    a drain region disposed in the semiconductor body and in Ohmic connection with the drift region;
    a drain terminal arranged on the second side and in Ohmic connection with at least one of the drift region and the drain region;
    a gate field plate adjoining the gate terminal, arranged in the inactive area spaced apart from the source terminal and/or the source field plate, and/or at least substantially surrounding the source terminal in the projection; and
    a drain line and/or a drain field plate in Ohmic connection with the drain terminal, arranged on the first side and in the inactive area, and/or in the projection at least substantially surrounding the source terminal, the gate field plate and/or the gate terminal.

7. The semiconductor device of claim 5, wherein the capacitor at least partly bridges a gap between the source contact structure and the gate contact structure, wherein the capacitor is at least partly arranged underneath the gate contact structure, wherein the capacitor is at least partly arranged underneath an edge termination structure, wherein the capacitor overlaps in the projection with an edge termination structure, wherein at least one of the second conductor and the first conductor is implemented as a respective conductive plate, wherein the capacitor comprises a dielectric medium arranged between the first conductor and the second conductor, wherein the dielectric medium adjoins and/or is provided by a first isolation layer of the dielectric structure, and/or wherein the dielectric medium adjoins and/or is provided by a second isolation layer of the dielectric structure which is arranged on the first isolation layer.

8. The semiconductor device of claim 5, wherein the first conductor and the gate electrode are formed by a contiguous conductive layer arranged on the first side.

9. The semiconductor device of claim 5, wherein the second conductor is arranged above the first conductor.

10. The semiconductor device of claim 5, wherein at least one of the first conductor and the second conductor comprises a non-monocrystalline semiconductor material.

11. The semiconductor device of claim 5, wherein a capacitance of the capacitor is at least 10% of a gate-source capacitance of the active area.

12. The semiconductor device of claim 5, wherein a capacitance of the capacitor is larger than about 30 pF.

13. The semiconductor device of claim 5, wherein a specific capacitance of the capacitor is larger than about 170 $pF/mm^2$.

14. The semiconductor device of claim 5, wherein the active area has in the projection a surface area of at most about 50 $mm^2$.

15. The semiconductor device of claim 5, wherein the capacitor overlaps in the projection with at least one of a gap arranged between the source terminal and the gate terminal, the source terminal, the gate terminal and the gate field plate.

16. The semiconductor device of claim 15, further comprising an electrostatic discharge protection structure formed in the inactive area, formed on the first side, embedded in the dielectric structure, bridging the gap and/or overlapping with the gap.

17. The semiconductor device of claim 5, wherein the active area comprises a plurality of transistor cells, wherein the inactive area at least partly surrounds the active area in the projection, and/or wherein the inactive area comprises a peripheral area which is, in a projection onto to the first side and/or the second side, arranged between the active area and an edge of the semiconductor body.

18. The semiconductor device of claim 5, wherein the semiconductor device is implemented as a MOSFET, wherein the semiconductor device is implemented as an IGBT, wherein the semiconductor device is implemented as a power semiconductor device, and/or wherein the semiconductor device is implemented as a charge compensation semiconductor device.

19. A method for manufacturing a semiconductor device comprising a transistor, the method comprising:
   providing a semiconductor body comprising a first side, a second side opposite the first side, an active area, an inactive area being, in a projection onto a horizontal plane substantially parallel to the first side and/or the second side, adjacent to the active area, and a source region adjacent to the first side, and extending to a first pn-junction arranged in the active area;
   forming a dielectric structure comprising two embedded conductive layers on the first side so that a first layer of the two conductive layers is arranged in the inactive area and that a second layer of the two conductive layers comprises a first portion forming a gate electrode overlapping in the projection onto the horizontal plane with the first pn-junction, and a second portion spaced apart from and overlapping in the projection onto the horizontal plane with the first conductive layer so that a vertical distance between the first conductive layer and the second portion is less than about 200 nm; and
   forming on the dielectric structure a source terminal in Ohmic connection with the source region and the first layer.

20. The method of claim 19, further comprising at least one of:
   forming on the dielectric structure a gate terminal in Ohmic connection with the second conductive layer;
   forming the first layer on a lower dielectric sub-structure of the dielectric structure, the lower dielectric sub-structure comprising a gate dielectric layer in the active area and a field dielectric layer in the inactive area;
   depositing an intermediate dielectric layer on the first layer;
   thinning the intermediate dielectric layer above the first layer;
   forming the second layer; and
   depositing an upper dielectric layer of the dielectric structure.

* * * * *

UNITED STATES PATENT AND TRADEMARK OFFICE
CERTIFICATE OF CORRECTION

| | |
|---|---|
| PATENT NO. | : 10,504,891 B2 |
| APPLICATION NO. | : 16/058728 |
| DATED | : December 10, 2019 |
| INVENTOR(S) | : J. Weyers et al. |

It is certified that error appears in the above-identified patent and that said Letters Patent is hereby corrected as shown below:

On the Title Page

Abstract (Line 3), please change "onto to the" to -- onto the --.

In the Claims

Column 23, Line 21 (Claim 1, Line 5), please change "onto to the" to -- onto the --.
Column 23, Line 27 (Claim 1, Line 11), please change "he" to -- the --.
Column 24, Line 9 (Claim 5, Line 6), please change "onto to the" to -- onto the --.
Column 25, Line 35 (Claim 17, Line 5), please change "onto to the" to -- onto the --.

Signed and Sealed this
Fourth Day of February, 2020

Andrei Iancu
*Director of the United States Patent and Trademark Office*